(12) United States Patent
Lee et al.

(10) Patent No.: US 8,679,707 B2
(45) Date of Patent: Mar. 25, 2014

(54) METHOD OF FABRICATING A LITHOGRAPHY MASK

(75) Inventors: Hsin-Chang Lee, Hsin-Chu Xian (TW); Yun-Yue Lin, Hsinchu (TW); Pei-Cheng Hsu, Taipei (TW); Chia-Jen Chen, Jhudong Township, Hsinchu County (TW); Ta-Cheng Lien, Cyonglin Township, Hsinchu County (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 13/564,334

(22) Filed: Aug. 1, 2012

(65) Prior Publication Data

US 2014/0038088 A1 Feb. 6, 2014

(51) Int. Cl.
*G03F 1/24* (2012.01)
*G03F 1/22* (2012.01)

(52) U.S. Cl.
USPC ............................................................ 430/5

(58) Field of Classification Search
USPC .................... 430/5, 322, 323, 311; 378/35
See application file for complete search history.

(56) References Cited

U.S. PATENT DOCUMENTS

| 8,021,807 B2 | 9/2011 | Hosoya |
| 2008/0070128 A1* | 3/2008 | Wu et al. ............................ 430/5 |

* cited by examiner

*Primary Examiner* — Stephen Rosasco
(74) *Attorney, Agent, or Firm* — Haynes and Boone, LLP

(57) ABSTRACT

A method of fabricating an extreme ultraviolet (EUV) mask is disclosed. The method includes providing a substrate, forming a reflective multilayer (ML) over the substrate, forming a buffer layer over the reflective ML, forming an absorption layer over the buffer layer and forming a capping layer over the absorption layer. The capping layer and the absorption layer are etched to form the EUV mask.

20 Claims, 5 Drawing Sheets

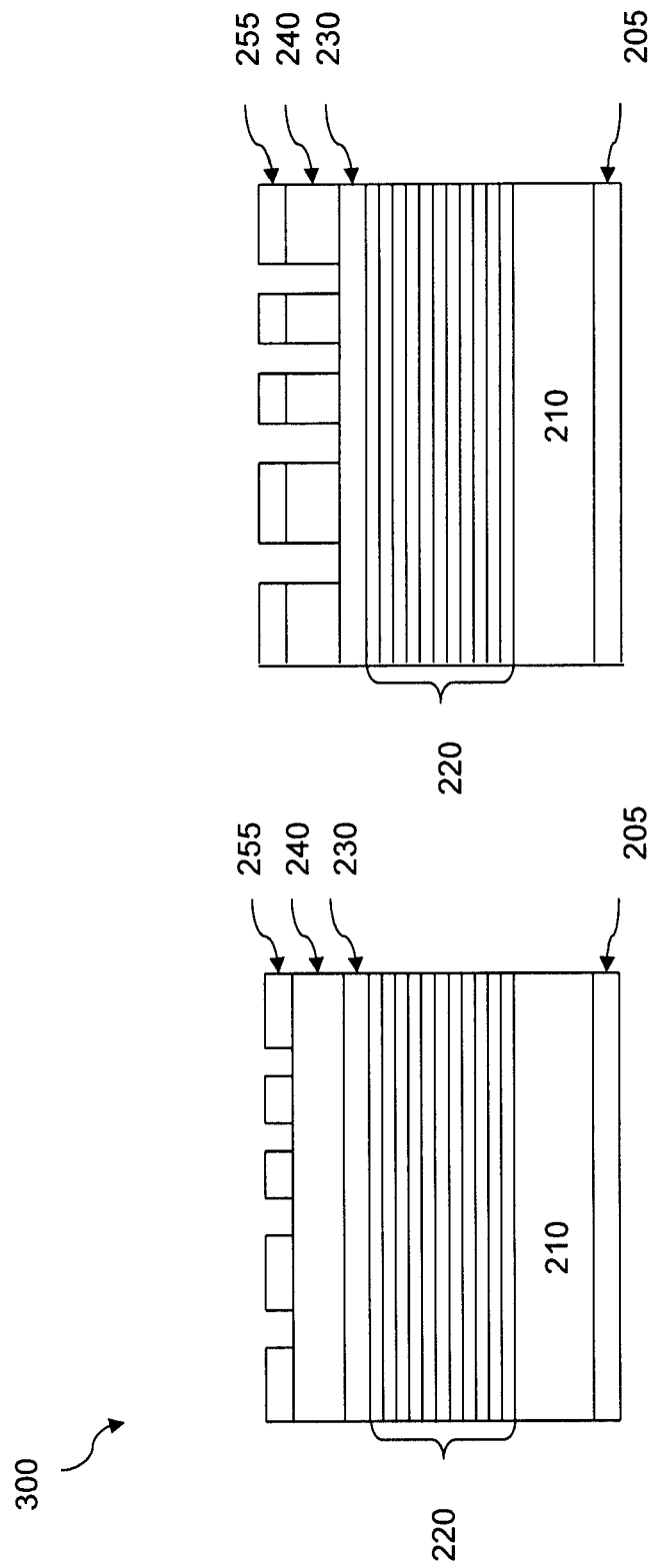

METHOD OF FABRICATING A LITHOGRAPHY MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example, extreme ultraviolet lithography (EUVL) is often implemented to provide a higher resolution lithography process. Mask sets used in EUV (and other high-resolution) lithography presents new challenges. For example, some EUV masks will include an absorption layer. When etching the absorption layer, it is important to provide reduced process disturbance and reduced particle generation. It is desired to have improvements in this area.

BRIEF DESCRIPTION OF THE DRAWINGS

Aspects of the present disclosure are best understood from the following detail description when read with the accompanying figures. It is noted that, in accordance with the standard practice in the industry, various features are not drawn to scale. In fact, the dimensions of the various features may be arbitrarily increased or reduced for clarity of discussion.

FIGS. 4 and 5A-5B are cross-sectional views of an EUV mask constructed according to method of FIG. 2.

DETAILED DESCRIPTION

Figure 1:
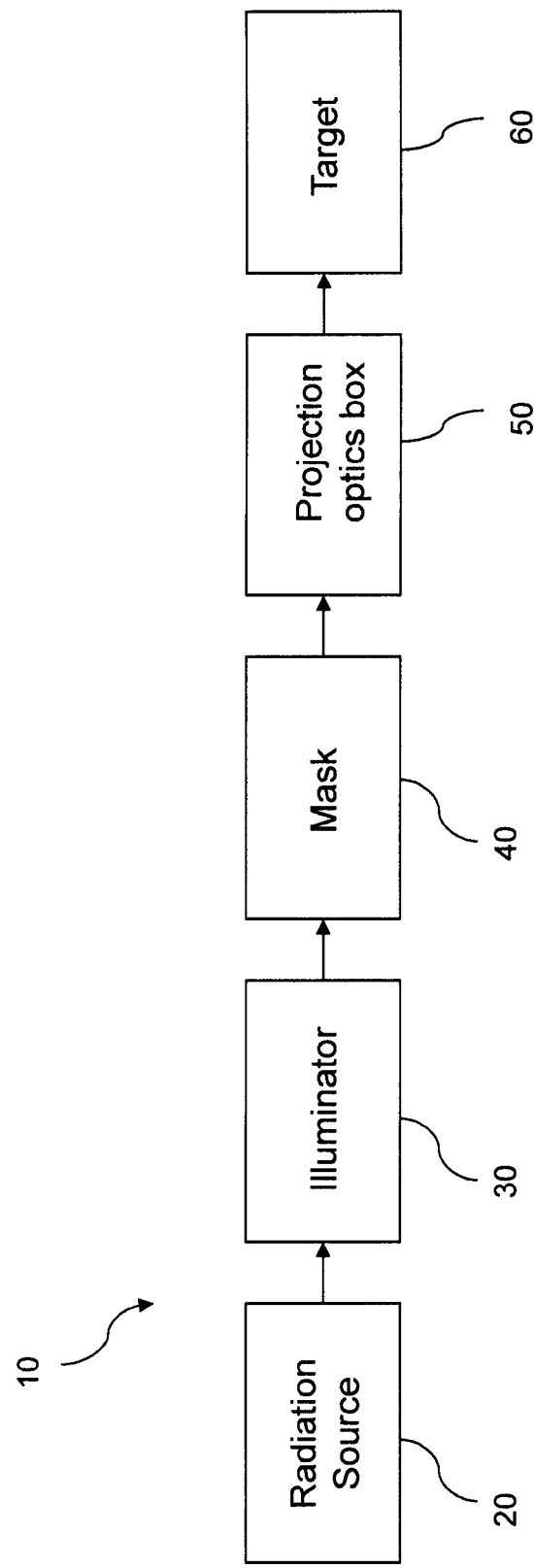
FIG. 1 is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, an EUV lithography system 10 that may benefit from one or more embodiments of the present invention is disclosed. The EUV lithography system 10 includes a radiation source 20, an illuminator 30, a mask 40 (in the present disclosure, the terms of mask, photomask, and reticle are used to refer to the same item), a projection optics box (POB) 50, and a target 60 such as a semiconductor wafer on a substrate stage. However, other configurations and inclusion or omission of devices may be possible.

In the present embodiment, the radiation source 20 includes a source providing electromagnetic radiation having a wavelength in the EUV range. For example, the radiation source 20 provides EUV radiation having a wavelength of approximately 13.5 nm. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto the mask 40. The mask 40 can be a transmissive mask or a reflective mask. In the present embodiment, the mask 40 is a reflective mask such as described in further detail below. The mask 40 may incorporate other resolution enhancement techniques such as phase-shifting mask (PSM) and/or optical proximity correction (OPC).

The electromagnetic radiation reflected from the mask 40 (e.g., a patterned radiation beam) is collected by the POB 50. The POB 50 may have refractive optics or reflective optics. The POB 50 may include a magnification of less than one (thereby reducing the patterned image included in the radiation). The POB 50 directs the patterned radiation to the target 60 (e.g., a semiconductor wafer). The target 60 includes a photosensitive layer (e.g., photoresist or resist), which is sensitive to the EUV radiation. The target 60 may be held by a target substrate stage. The target substrate stage provides control of the target substrate position such that the image of the reticle is scanned onto the target substrate in a repetitive fashion (though other lithography methods are possible). The lithography system 10 or portion thereof may include a vacuum atmosphere.

The following description refers to the mask 40 and a mask fabrication process. The mask fabrication process includes two steps: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. In an EUV lithography, types of EUV mask include binary intensity mask (BIM) and phase-shifting mask (PSM). An example of BIM includes an almost totally absorptive region (also referring to as an opaque region) and a reflective region. In the opaque region, an absorber is present and an incident light beam is almost fully absorbed by the absorber. In the reflective region, the absorber is removed and the incident light is reflected by a multilayer (ML). A PSM includes an absorptive region and a reflective region. A portion of the incident light reflects from the absorptive region with a proper phase difference with respect to reflected light from the reflective region to enhance the resolution and imaging quality. The PSM can be attenuated PSM (AltPSM)

or alternating PSM (AttPSM). An AttPSM usually has 2%-15% of reflectivity from its absorber, while an AltPSM usually has larger than 50% of reflectivity from its absorber.

Figure 2:
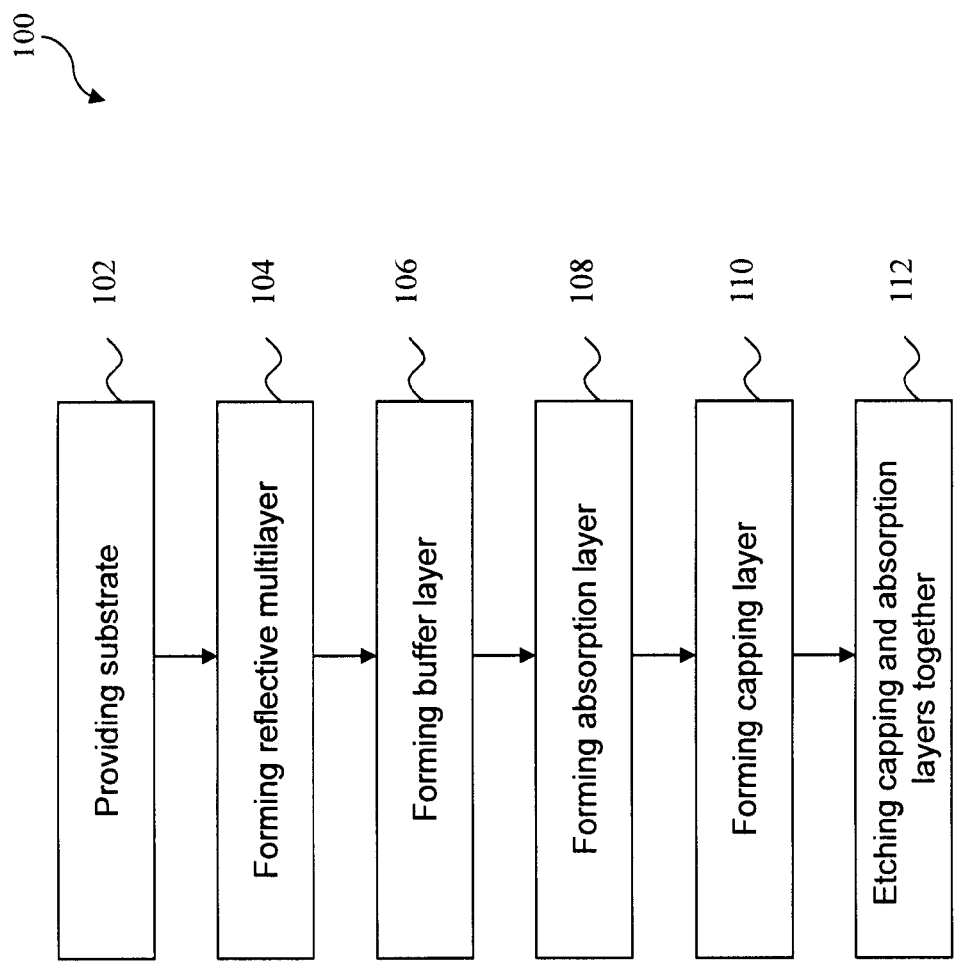
FIG. 2 is a flow chart of an example method for fabricating an EUV mask according to various aspects of the present disclosure.
Figure 3:
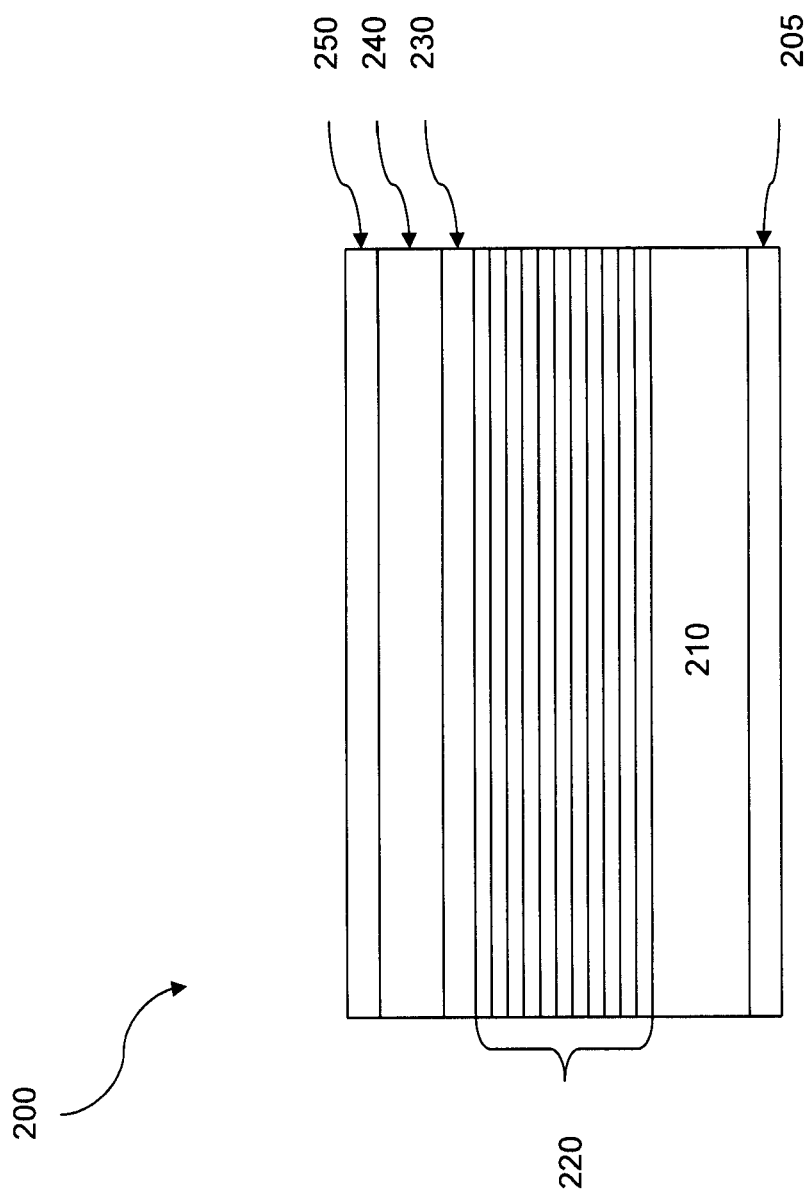
FIG. 3 is a cross-sectional view of a mask blank constructed according to the method of FIG. 2.
Figure 4:
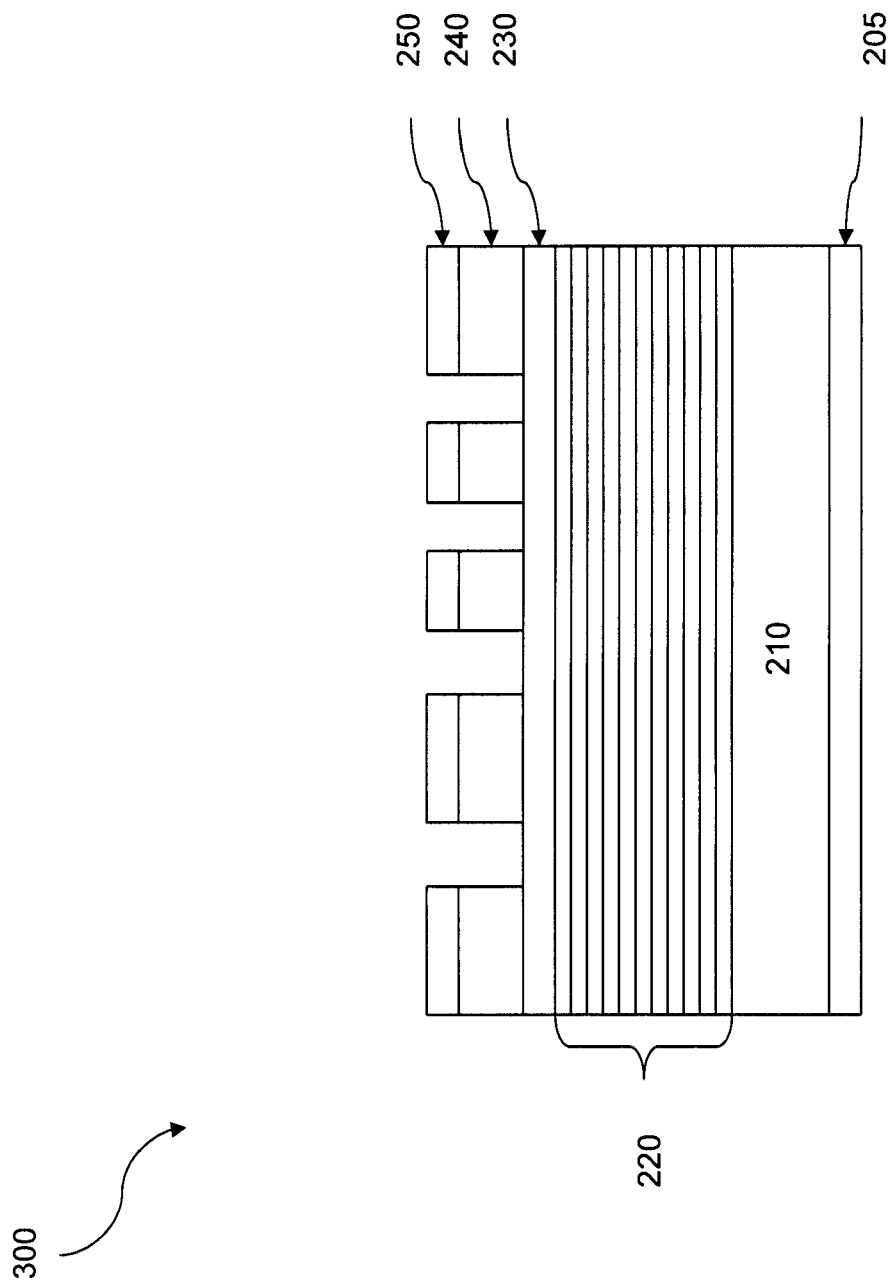

FIG. 2 is a flowchart of a method 100 of fabricating an EUV mask constructed according to aspects of the present disclosure. FIG. 3 is a sectional view of embodiment of a blank mask 200 at various fabrication stages of the method 100. The blank mask 200 and the method 100 of fabricating the same are collectively described with reference to FIGS. 2 and 3. FIGS. 4 and 5 are sectional views of an EUV mask 300 at various fabrication stages of the method 100. The EUV mask 300 and the method 100 of fabricating the same are collectively described with reference to FIGS. 2 and 4-5.

Referring to FIGS. 2 and 3, the method 100 begins at step 102 by providing a substrate 210. The substrate 210 may include a substrate made of low thermal expansion material (LTEM). The LTEM material may include $TiO_2$ doped $SiO_2$, and/or other low thermal expansion materials known in the art. The LTEM substrate 210 serves to minimize image distortion due to mask heating. In the one embodiment, the LTEM substrate 210 includes materials with a low defect level and a smooth surface. In addition, a conductive layer 205 may be coated on a first surface of the substrate 210 (as shown in the figure) for the electrostatic chucking purpose. The conductive layer 205 may include chromium nitride (CrN), tantalum nitride (TaN), tantalum boron nitride (TaBN), tantalum oxynitride (TaON), though other compositions are possible.

The method 100 proceeds to step 104 by forming a reflective multilayer (ML) 220 over a second, opposite, surface of the LTEM substrate 210. According to Fresnel equations, light reflection will occur when light propagates across the interface between two materials of different refractive indices. The reflected light is larger when the difference of refractive indices is larger. To increase the reflected light, one may also increase the number of interfaces by deposing the ML 220 with alternating materials. This lets light reflected from different interfaces interfere constructively by choosing appropriate thickness for each layer inside the ML 220. However, the absorption of the employed materials for the ML 220 limits the highest reflectivity that can be achieved. The ML 220 includes a plurality of film pairs, such as molybdenum-silicon (Mo/Si) film pairs (e.g., a layer of molybdenum above or below a layer of silicon in each film pair). Alternatively, the ML 220 may include molybdenum-beryllium (Mo/Be) film pairs, or any material that is highly reflective at EUV wavelengths can be utilized for the ML 220. The thickness of each layer of the ML 220 depends on the EUV wavelength and the incident angle. The thickness of the ML 220 is adjusted to achieve a maximum constructive interference of the EUV light reflected at each interface and a minimum absorption of the EUV light by the ML 220. The ML 220 may be selected such that it provides a high reflectivity to a selected radiation type/wavelength. A typical number of film pairs is 20-80, however any number of film pairs is possible. In an embodiment, the ML 220 includes forty pairs of layers of Mo/Si. Each Mo/Si film pair has a thickness of about 7 nm, with a total thickness of 280 nm. In this case, a reflectivity of about 70% is achieved.

The method 100 proceeds to step 106 by forming a buffer layer 230 over the ML 220. The buffer layer 230 serves as an etching stop layer in a subsequent patterning or a repairing process of an absorption layer, which will be described in detail later. The buffer layer 230 has different etching characteristics from the absorption layer. The buffer layer 230 includes ruthenium (Ru), Ru compounds such as RuB and RuSi. A low temperature deposition process is often chosen for the buffer layer 230 to prevent inter-diffusion of the ML 220. In the present embodiment, the buffer layer 230 includes Ru.

The method 100 proceeds to step 108 by forming an absorption layer 240 over the buffer layer 230. The absorption layer 240 preferably absorbs radiation in the EUV wavelength range projected onto a patterned EUV mask 300. The absorption layer 240 includes a single layer or multiple layers from a group of chromium, chromium oxide, titanium nitride, tantalum nitride, tantalum, titanium, or aluminum-copper, palladium, tantalum boron nitride, aluminum oxide, molybdenum, or other suitable materials. With a proper configuration of film layers, the absorption layer 240 will provide process flexibility in a subsequent etching process by different etch characteristics of each film. In the present embodiment, a material of the absorption layer 240 includes TaBN, TaN and TaON.

The method 100 proceeds to step 110 by forming a capping layer 250 over the absorption layer 240 to prevent oxidation of the absorption layer 240 and obtain a better process control. The capping layer 250 includes chromium, tantalum, titanium, Molybdenum, aluminum, silicon and their oxide compounds or oxynitride compounds. In one embodiment, a material of the capping layer 250 is selected such that it obtains an adequate etch rate in a subsequent absorption layer etching process by using same etching chemistries and etching parameters. The composition of metal compound of the capping layer 250 may be selected such as MxOy or MxOyNz (here M represents metal) with values of x, y, z value are from 0 to 1, individually. As an example, the capping layer 250 includes Cr. In another embodiment, a material of the capping layer 250 is selected such that it has a fairly different etch rate than the absorption layer 240 in a subsequent absorption layer etching process.

One or more of the layers 205, 220, 230, 240 and 250 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD) and/or other methods known in the art.

Referring to FIGS. 2 and 4-5, the method of 100 proceeds to step 112 by etching a portions of the capping layer 250 and the absorption layer 240 to form an EUV mask 300. First, a lithography patterning process is performed to define IC patterns on the blank mask 200. The patterning process includes resist coating (e.g., spin-on coating), soft baking, target aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing.

Next, an etching process is followed to remove portions of the capping layer 250 and the absorption layer 240 to form the EUV mask 300. With the patterned resist layer serves as an etch mask, the underlying layers (e.g. the capping layer 250 and the absorption layer 240) are etched through the openings of the patterned resist layer while the portion of the underlying layers covered by the resist layer remains. The etching process may include dry (plasma) etching, wet etching, and/or other etching methods. For example, a dry etching process may implement an oxygen-containing gas, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, other suitable gases and/or plasmas, and/or combinations thereof. After the etching process, the patterned resist layer may be removed by a suitable technique, such as stripping or ashing.

In one embodiment, a continuously dry etching is carried out to etch the capping layer 250 and the absorption layer 240 together, as shown in FIG. 4. The capping layer 250 and the absorption layer 240 are etched at one step with a same etching chemistries and etching parameters, such as gasses, gas flows, power and pressure. As an example, the dry etching is employed halogen etching gases, such as Cl, SF6 mixed with O2. The etching starts at etching the capping layer 250 and continuously carries on to etch the absorption layer 250. Thus both of the capping layer 250 and the absorption layer 240 are etched by chlorine and oxygen based gases at one step. A one-step etching process is attractive for its reduced process complexity and for process disturbance. Process disturbance can be produced by changing etching chemistry and etching parameters, which usually involves several sub-processes, such as exhausting a previous etching chemistry residues, introducing a new etching chemistry, ramping up and stabilizing the new etching chemistry, etc. A process disturbance may bring up concerns about particle generation and may result in adding cleaning processes during or after the etching process.

In another embodiment, a multi-step etching process is chosen to form the EUV mask 300. As an example, a two-step etch is carried out to etch the capping layer 250 first (referred to as a first etch) to form a patterned capping layer 255, as shown in FIG. 5A. The capping layer 250 is etched by a first etching employed one or more gases from the group consisting of chlorine ($Cl_2$) and sulfur hexafluoride ($SF_6$) mixed with oxygen ($O_2$), $Cl_2$ and $SF_6$. Then the absorption layer 240 is etched by a second etching employed one or more gases from the group consisting of $Cl_2$ and $SF_6$ mixed with inert gas, $Cl_2$, $SF_6$, $Cl_2$ combined with $SF_6$, and SF6 mixed with oxygen (O2). In one embodiment, the patterned resist layer is removed after the first etch. A second etch is performed to etch the absorption layer 240 using the patterned capping layer 255 as an etch mask, as shown in FIG. 5B. The second etch is configured to have a substantially high etch selectivity with respect to the buffer layer 230. In another embodiment, both of the patterned resist layer and the patterned capping layer 255 serve as the etch mask in the second etch. The patterned resist layer is removed after the second etch.

A multi-step etching process provides multiple etch stages and each etch stage may achieve its own etch selectivity and profile by employing different etching chemistries and parameters, such as such as gasses, gas flows, power and pressure. A multi-step etching process is attractive for its etch selectivity and profile. A multi-step etching process also has benefit for process critical dimension (CD) control.

The EUV mask 300 may incorporate other resolution enhancement techniques such as an optical proximity correction (OPC). The EUV mask 300 may undergo a defect repair process by a mask repair system. The mask repair system is a suitable system, such as an e-beam repair system and/or a focused ion beam (FIB) repair system.

Based on the above, it can be seen that the present disclosure offers a method of fabricating an EUV mask. The method provides a configuration of materials of an absorption layer and its capping layer and incorporates with a one-step etching process to etch both the capping layer and the absorption layer with substantially same etching chemistries and etching parameters. The method demonstrates a low disturbance and low particle generation etching process for patterning the absorption layer. Alternatively the method also offers a multi-step etching process to achieve a targeted etch selectivity and profile.

The present disclosure provides many different embodiments of fabricating an EUV mask that provide one or more improvements over the prior art. In one embodiment, a method of fabricating an extreme ultraviolet (EUV) mask includes providing a substrate, forming a reflective multilayer (ML) over the substrate, forming a buffer layer over the reflective ML, forming an absorption layer over the buffer layer and forming a capping layer over the absorption layer. The capping layer and the absorption layer are etched to form the EUV mask.

In another embodiment, a method of fabricating an extreme ultraviolet (EUV) mask includes providing a low thermal expansion material (LTEM) substrate, forming a reflective multilayer (ML) over the LTEM substrate, forming a buffer layer over the reflective ML, forming an absorption layer over the buffer layer, forming a capping layer over the absorption layer and performing a continuous plasma dry etching to etch the capping layer and the absorption layer with same etching gases and etching parameters.

In yet another embodiment, a method of fabricating an extreme ultraviolet (EUV) mask includes coating a conductive layer, such as chromium nitride (CrN), tantalum nitride (TaN), tantalum boron nitride (TaBN), tantalum oxynitride (TaON), at a first surface of a substrate, providing a reflective multilayer (ML) at a second, opposite surface of the substrate, forming a ruthenium (Ru) buffer layer over the reflective ML, forming an absorption layer on the Ru buffer layer, wherein the absorption layer includes materials from the group consisting of tantalum nitride, tantalum oxynitride and tantalum boron nitride, forming a capping layer on the absorption layer, wherein the capping layer includes materials from the group consisting of chromium, chromium nitride, chromium oxynitride and chromium oxide and performing a multi-step etching to etch the capping layer and the absorption layer.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an extreme ultraviolet (EUV) mask, the method comprising:
   providing a substrate;
   forming a reflective multilayer (ML) over a surface of the substrate;
   forming a conductive layer on an opposite surface of the substrate;
   forming a buffer layer over the reflective ML;
   forming an absorption layer over the buffer layer;
   forming a capping layer over the absorption layer; and
   etching the capping layer and the absorption layer.

2. The method of claim 1, wherein the absorption layer includes one or more materials from the group consisting of chromium, chromium oxide, titanium nitride, tantalum nitride, tantalum, titanium, aluminum-copper, palladium, tantalum boron nitride, aluminum oxide, molybdenum, molybdenum silicon, molybdenum silicon oxynitride, and molybdenum silicon nitride.

3. The method of claim 1, wherein the capping layer includes one or more metal materials from the group consisting of chromium (Cr), tantalum (Ta), titanium (Ti), molybdenum (Mo), aluminum (Al), and silicon.

4. The method of claim 1, wherein the capping layer includes metal compounds from the group consisting of $M_xO_y$, $M_xN_y$, and $M_xO_yN_z$.

5. The method of claim 4, wherein x, y and z values are from 0 to 1.

6. The method of claim 1, wherein the capping layer and the absorption layer are etched in a same etching step.

7. The method of claim 6, wherein the same etching step uses common etching parameters for both the capping layer and the absorption layer.

8. The method of claim 7, wherein the same etching step is a plasma dry etch that employs halogen gases including Cl and $SF_6$ mixed with $O_2$.

9. The method of claim 1, wherein the capping layer and the absorption layer are etched by a multi-step etching process that uses different etch chemistries and parameters in each step.

10. The method of claim 9, wherein the multi-step etching process comprises:
    etching the capping layer by employing one or more gases from the group consisting of chlorine ($Cl_2$) and sulfur hexafluoride ($SF_6$) mixed with oxygen ($O_2$), $Cl_2$, and $SF_6$; and
    using the etched capping layer as an etch mask to etch the absorption layer by employing one or more gases from the group consisting of $Cl_2$ and $SF_6$ mixed with an inert gas, $Cl_2$, $SF_6$, $Cl_2$ combined with $SF_6$, and $SF_6$ mixed with $O_2$.

11. A method of fabricating an extreme ultraviolet (EUV) mask, the method comprising:
    providing a low thermal expansion material (LTEM) substrate;
    forming a reflective multilayer (ML) over the LTEM substrate;
    forming a buffer layer over the reflective ML;
    forming an absorption layer over the buffer layer;
    forming a capping layer over the absorption layer; and
    performing a continuous plasma dry etching to etch the capping layer and the absorption layer.

12. The method of claim 11, wherein the absorption layer includes materials from the group consisting of tantalum nitride, tantalum, titanium, aluminum-copper, palladium, tantalum boron nitride, and aluminum oxide.

13. The method of claim 11, wherein the capping layer includes materials from the group consisting of chromium (Cr), tantalum (Ta), titanium, silicon, aluminum, molybdenum, silicon, oxide compounds thereof, nitride compounds thereof, and oxynitride compounds thereof.

14. The method of claim 11, wherein the buffer layer includes Ru.

15. The method of claim 11, wherein the capping layer and the absorption layer are etched at same etch step in the plasma etching process.

16. The method of claim 11, wherein the continuous plasma etching uses a same gas mixture for etching the capping layer and the absorption layer, the gas mixture including a chlorine-containing gas and an oxygen-containing gas.

17. The method of claim 11, wherein the continuous plasma etching uses substantially the same etching parameters for both the capping layer and the absorption layer.

18. The method of claim 17, wherein the etching parameters include one or more parameters from the group consisting of gas flow, power, and pressure.

19. A method of fabricating an extreme ultraviolet (EUV) mask, the method comprising:
    forming a conductive layer at a first surface of a substrate, wherein the conductive layer includes one or more from the group consisting of chromium nitride (CrN), tantalum nitride (TaN), tantalum boron nitride (TaBN), and tantalum oxynitride (TaON);
    forming a reflective multilayer (ML) at a second, opposite surface of the substrate;
    forming a Ru buffer layer on the reflective ML;
    forming an absorption layer on the Ru buffer layer, wherein the absorption layer includes materials from the group consisting of tantalum nitride, tantalum oxynitride, and tantalum boron nitride;
    forming a capping layer on the absorption layer, wherein the capping layer includes materials from the group consisting of chromium, chromium nitride, chromium oxynitride, and chromium oxide; and
    performing a multi-step etching to etch the capping layer and the absorption layer.

20. The method of claim 19, wherein the multi-step etching process comprises:
    etching the capping layer with an etching process having a substantially high etch selectivity with respect to the absorption layer; and
    using the etched capping layer as an etch mask to etch the absorption layer with an etching process having a substantially high etch selectivity with respect to the etched capping layer.

* * * * *